(12) United States Patent
See et al.

(10) Patent No.: US 12,424,446 B2
(45) Date of Patent: Sep. 23, 2025

(54) SILICON (Si) DRY ETCH FOR DIE-TO-WAFER THINNING

(71) Applicant: Applied Materials, Inc., Santa Clara, CA (US)

(72) Inventors: Guan Huei See, Singapore (SG); ChangBum Yong, Singapore (SG); Prayudi Lianto, Singapore (SG); Cheng Sun, Singapore (SG); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 274 days.

(21) Appl. No.: 18/086,150

(22) Filed: Dec. 21, 2022

(65) Prior Publication Data

US 2024/0213028 A1   Jun. 27, 2024

(51) Int. Cl.
*H01L 21/3065*     (2006.01)

(52) U.S. Cl.
CPC .............................. *H01L 21/3065* (2013.01)

(58) Field of Classification Search
None
See application file for complete search history.

(56) References Cited

U.S. PATENT DOCUMENTS

| | | |
|---|---|---|
| 2013/0099277 A1 | 4/2013 | Speck et al. |
| 2013/0241077 A1* | 9/2013 | Fuergut ............... H01L 23/5389 257/774 |
| 2015/0079790 A1* | 3/2015 | Nishimura .......... H01L 21/0337 438/696 |
| 2018/0158713 A1 | 6/2018 | Okita et al. |
| 2021/0090905 A1* | 3/2021 | See ........................ H01L 25/50 |

OTHER PUBLICATIONS

International Search Report for PCT/US2023/085377, detsd Apr. 23, 2024.

* cited by examiner

*Primary Examiner* — Stephanie P Duclair
(74) *Attorney, Agent, or Firm* — Moser Taboada

(57) ABSTRACT

A method of thinning a die engaged with a substrate is disclosed, utilizing dry etching of a top surface of the die with a plasma comprising fluorine to selectively remove the top surface of the die relative to a top surface of the substrate.

18 Claims, 4 Drawing Sheets

SILICON (Si) DRY ETCH FOR DIE-TO-WAFER THINNING

FIELD

Embodiments of the present disclosure generally relate to the field of semiconductor manufacturing processes, more particularly, to processes for thinning a die engaged with a substrate.

BACKGROUND

Current chip-to-wafer bonding is typically limited to the chip or die having a height or thickness of greater than about 30 micrometers ($\mu m$) due to limitation of thin die handling processes or equipment, which include limitations in die ejection failure causing die breakage, inherent high die stress causing die warpage that results in failing to bond the chip to the wafer, and the like.

However, the inventors have observed that relatively thin, e.g., less than 30 $\mu m$, die bonding may be desired for providing improved electrical and thermal properties and reducing form factor. Other improvements include stacking relatively thin dies, such as in dual-stacks of SRAM memory to achieve 3D-integration. However, technical challenges remain to achieve thinned die chip-to-wafer structures.

The inventors have observed that utilizing a relatively thin die of less than 30 $\mu m$ in chip-to-wafer bonding may be obtained when utilizing a thicker die bonded to the wafer or substrate, which may then be processed to achieve a thin top die. However, the inventors have observed that typical thinning processes such as grinding or chemical mechanical polishing (CMP) undesirably cause issues that lead to yield loss. For example, grinding exposes the die to high temperatures, pressures, and high mechanical shear forces which can cause chipping, cracking, and/or delamination of the die from the substrate. CMP has a relatively low removal rate of less than about 1 $\mu m$ per min and high cost. CMP is also limited due to the damage which may occur to the polishing pad that results from the topological aspects of the die.

Accordingly, the inventors have provided improved methods for thinning of a die bonded to a substrate.

SUMMARY

Methods for thinning a die engaged with a substrate are provided herein. In embodiments, a method of thinning a die engaged with a substrate comprises dry etching a top surface of the die with a plasma comprising fluorine to selectively remove the top surface of the die relative to a top surface of the substrate.

In embodiments, a method of thinning a chip bonded to a wafer substrate comprises dry etching, in a processing chamber, a top surface of the chip with a plasma comprising fluorine formed from $SF_6$, $CF_4$, $C_4F_8$ or a combination thereof to selectively remove the top surface of the chip relative to a top surface of the wafer substrate; wherein the chip comprises silicon; wherein at least a portion of a top surface of the wafer substrate comprises a protective layer; wherein at least one metal pad is embedded completely within the chip bonded to the wafer substrate, at least one metal pad is disposed beneath the protective layer, or both; and wherein no metal pad is contacted by the plasma comprising fluorine during the dry etching process.

In embodiments, a non-transitory computer readable medium, having instructions stored thereupon which, when executed, cause a processing chamber to perform a method for thinning of a die engaged with a substrate, comprising dry etching a top surface of the die with a plasma comprising fluorine to selectively remove the top surface of the die relative to a top surface of the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
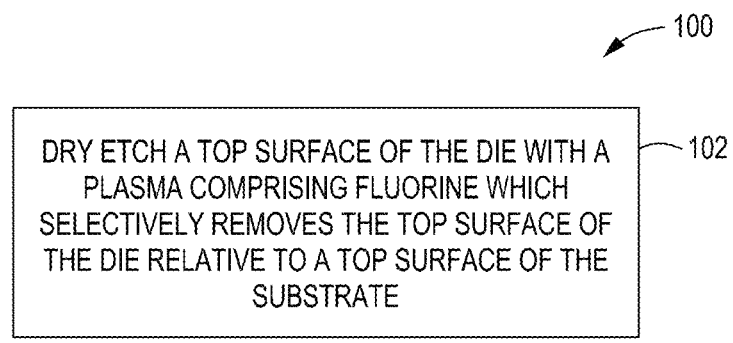
FIG. 1 depicts a flow diagram of a method of thinning a die engaged with a substrate, comprising dry etching a top surface of the die with a plasma comprising fluorine to selectively remove the top surface of the die relative to a top surface of the substrate in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

In embodiments, a method of thinning a die engaged with a substrate, comprises dry etching a top surface of the die with a plasma comprising fluorine to selectively remove the top surface of the die relative to a top surface of the substrate.

In embodiments, the plasma comprising fluorine is formed from $SF_6$, $CF_4$, $C_4F_8$ or a combination thereof. In embodiments, the top surface of the die is removed at a rate of greater than or equal to about 1 $\mu m/min$.

In embodiments, the die engaged with the substrate is a chip bonded to a wafer, the chip having a thickness of greater than or equal to about 50 $\mu m$ prior to the dry etching of the top surface of the die, and the die having a thickness of less than or equal to about 30 $\mu m$ after the dry etching of the top surface of the die. In embodiments, over 50 $\mu m$ of a thickness of the die is removed. In embodiments, the substrate is maintained at a temperature of less than or equal to about 80° C. during the dry etching of the top surface.

In embodiments, the substrate further comprises a protective layer disposed over at least a portion of the substrate. In embodiments, the protective layer comprises SiN, SiCN, oxygen-doped silicon nitride, a metal oxide layer, or a combination thereof. In embodiments, the protective layer comprises an organic photo resist.

In embodiments, the die is bonded to a dielectric layer disposed on top of the substrate, comprising a metal oxide, SiCN, SiN, or a combination thereof. In embodiments, the dielectric layer is a protective layer which prevents the plasma comprising fluorine from dry etching a portion of the substrate located below the dielectric layer.

In embodiments, a ratio of a rate at which the top surface of the die is removed relative to a rate at which the top surface of the substrate is removed is greater than or equal to about 100:1.

In embodiments, the die, the substrate, or both comprise a metal pad, and in embodiments, no portion of the metal pad is contacted by the plasma comprising fluorine.

In embodiments, a method of thinning a chip bonded to a wafer substrate, comprises dry etching, in a processing chamber, a top surface of the chip with a plasma comprising fluorine formed from $SF_6$, $CF_4$, $C_4F_8$ or a combination thereof to selectively remove the top surface of the chip relative to a top surface of the wafer substrate; wherein the chip comprises silicon; wherein at least a portion of a top surface of the wafer substrate comprises a protective layer; wherein at least one metal pad is embedded completely within the chip bonded to the wafer substrate, at least one metal pad is disposed beneath the protective layer, or both; and wherein no metal pad is contacted by the plasma comprising fluorine. In embodiments, the protective layer comprises SiN, SiCN, oxygen-doped silicon nitride, a metal oxide, or a combination thereof. In embodiments, the protective layer comprises a photo resist.

In embodiments, the top surface of the chip is removed at a rate of greater than or equal to about 1 μm/min. In embodiments, the chip has a thickness of greater than or equal to about 50 μm prior to the dry etching of the top surface of the chip with the plasma comprising fluorine, and the chip has a thickness of less than or equal to about 30 μm after the dry etching of the top surface of the chip.

In embodiments, over 50 μm of a thickness of the chip is removed during the method of thinning the chip bonded to the wafer substrate. In embodiments, the wafer substrate is maintained at a temperature of less than or equal to about 80° C.

The method is not limited according to the method by which the die is bonded to the substrate, which may include direct bonding such as fusion bonding, which may include plasma activated fusion bonding, various hybrid bonding methodologies, anodic bonding, covalent wafer bonding, and/or the like.

FIG. 1 is a flowchart of a method 100 according to an embodiment. In some implementations, the method 100 of FIG. 1 may be performed by a device.

As shown in FIG. 1, method 100 may include dry etching a top surface 33 of the die 32 (see FIG. 2) with a plasma comprising fluorine radicals 54 to selectively removes the top surface 33 of the die 32 relative to a top surface of the substrate 34 (block 102).

Although FIG. 1 shows example blocks of method 100, in some implementations, method 100 may include additional blocks than those depicted in FIG. 1.

In embodiments, the method 100 (see FIG. 1) utilizes a plasma comprising fluorine radicals which erode the silicon layer of the die at a much faster rate than silicon oxide or silicon nitride or other materials on the surface of the substrate. Accordingly, the dry etching rate of the silicon surface of the die is much faster than the dry etching rate of the substrate. In embodiments, the substrate may comprise an upper surface which includes a protective or passivation layer having a relatively low etching rates in plasma comprising fluorine radicals relative to silicon.

Figure 2:
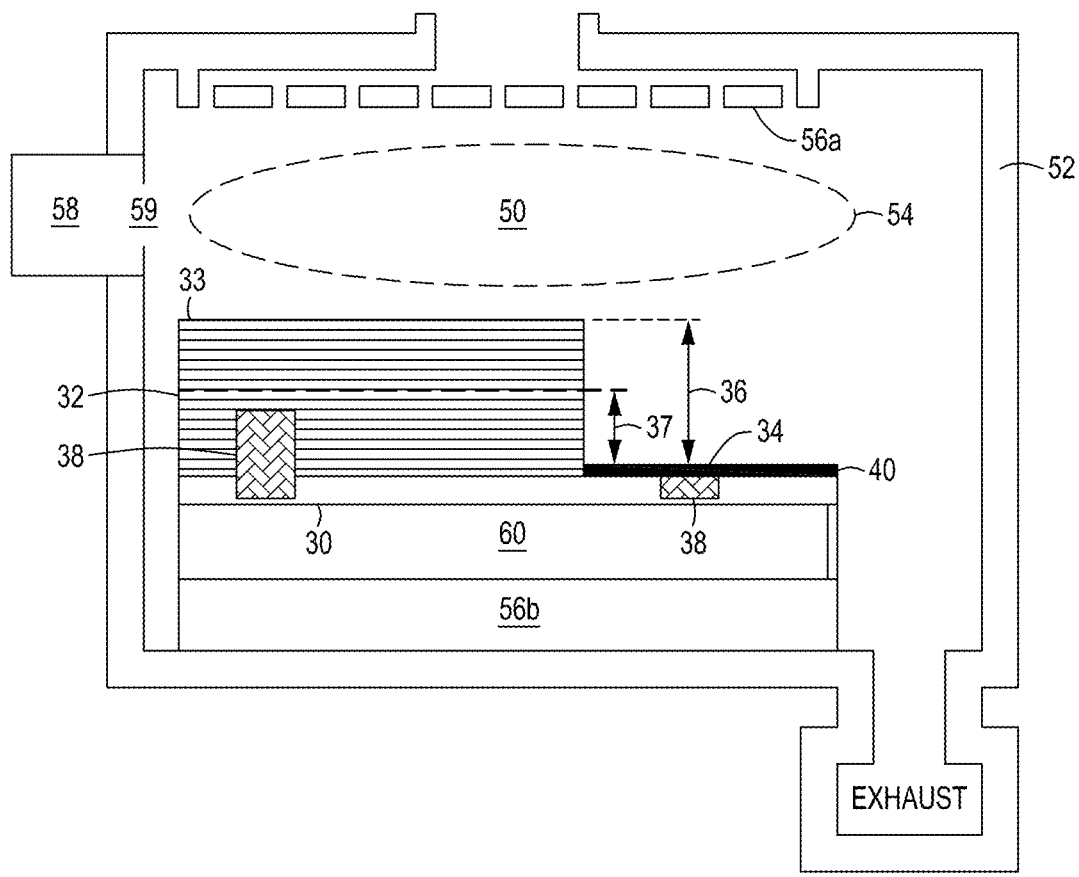
FIG. 2 is a schematic diagram of an etching chamber having a die engaged with a substrate in accordance with embodiments of the present disclosure.

FIG. 2 is a schematic diagram of an etching chamber having a die engaged with a substrate in accordance with embodiments of the present disclosure. As shown in FIG. 2, the substrate 30 may be any suitable substrate for use in a semiconductor article and may include one or more of silicon (Si), silicon oxide ($SiO_2$), or the like. One or more dies 32 are engaged with the substrate, e.g., bonded thereto. In embodiments, a plurality of dies 32 are bonded to the substrate 30. In embodiments, the die 32 is a chip and the substrate 30 is a wafer. In embodiments, the substrate 30 may include a plurality of layers, or may consist essentially of a dielectric layer. In some embodiments, the dielectric layer may be disposed atop one or more additional dielectric layers (not shown), such as silicon oxide, silicon nitride, silicon carbide, or the like.

In addition, the substrate 30 may include additional layers of materials or may have one or more completed or partially completed structures or devices formed in or on the substrate, such as one or more metal pads 38 disposed therein. In some embodiments, a layer such as a logic device or the like, or a portion of a device requiring electrical connectivity, such as a gate, a contact pad, a conductive line or via, or the like, may be disposed in the substrate 30 and aligned with one or more features. As used herein, a "layer" need not be a continuous structure extending across an entire surface of the substrate 30.

In embodiments, the substrate 30 may be, for example, a doped or undoped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 30 may be a semiconductor wafer.

The substrate 30 is not limited to any particular size or shape. The substrate can be a round wafer having a 200 mm diameter, a 300 mm diameter or other diameters, such as 450 mm, among others. The substrate can also be any polygonal, square, rectangular, curved or otherwise non-circular workpiece, such as a polygonal glass substrate used in the fabrication of flat panel displays.

In embodiments, the etching process may include placing the substrate 30 comprising at least one die 32 bonded to a top surface 34 of the substrate 30 in a process chamber 52, which in embodiments may include placing the substrate 30 on a carrier 60 or a chuck within an etching zone 50, and introducing a plasma comprising fluorine radicals 54 into the etching zone 50, as shown in FIG. 2. In embodiments, the plasma comprising fluorine radicals 54 may be produced external to the process chamber 52 e.g., via a remote plasma source 58 providing a remote plasma comprising a fluorine containing gas 59, or the plasma comprising fluorine radicals 54 may be produced within the process chamber 52, e.g., as an inductively coupled plasma (ICP) produced by process electrodes 56a and 56b. In embodiments, the plasma comprising fluorine radicals 54 is produced from a fluorine-containing gas 59 such as $SF_6$, $CF_4$, $NF_6$, $C_4F_8$, $CHF_3$, and/or the like, which in embodiments may also include a diluent gas or mixture of gases such as argon, nitrogen, helium, and/or the like.

In embodiments, the plasma comprising fluorine radicals 54 is sustained by applying a current at a frequency from about 400 KHz to about 15 MHz to process electrodes 56a and 56b arranged about the etching zone 50, at a power level of from about 50 watts to about 2000 watts. During the etching process, the substrate 30 is maintained at temperatures of less than or equal to about 80° C., or less than or equal to about 75° C., or less than or equal to about 70° C., or less than or equal to about 60° C., and greater than or equal to about 20° C., or greater than or equal to about 30° C.; for example, from about 20° C. to about 80° C.

In embodiments, the plasma comprising fluorine radicals 54 etches the top surface 33 of the die 32 with a removal rate which relative to a rate at which the top surface of the substrate 34 is removed, is greater than or equal to about 100:1, or greater than or equal to about 500:1, or greater than or equal to about 1000:1, or greater than or equal to about 5000:1.

In embodiments, the top surface 33 of the die 32 is removed at a rate of greater than or equal to about 1 µm/min, or greater than or equal to about 1.5 µm/min, or greater than or equal to about 3 µm/min, or greater than or equal to about 5 µm/min, or greater than or equal to about 10 µm/min.

In embodiments, over 50 µm, or over 100 µm, or over 150 µm of a thickness 36 of the die 32 is removed.

In embodiments, the die 32, the substrate 34, or both may comprise at least one metal pad 38. In embodiments, as shown in FIG. 2, a metal pad 38 disposed within the substrate 30 is covered by the protective layer 40 such that no portion of the metal pad 38 is contacted the plasma comprising fluorine radicals 54 during the dry etching of the substrate.

Figure 3A:
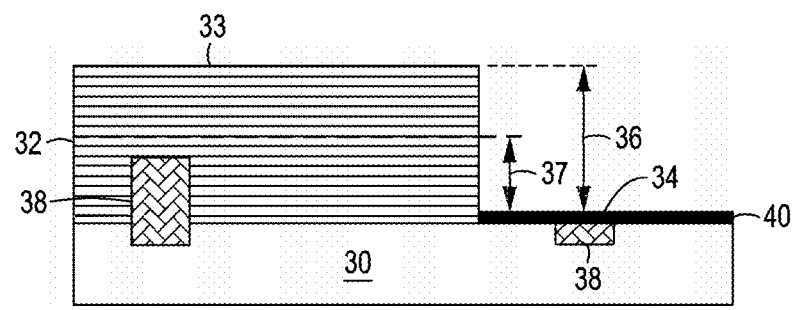
FIG. 3A depicts a die engaged with a substrate prior to dry etching in accordance with embodiments of the present disclosure.
Figure 3B:
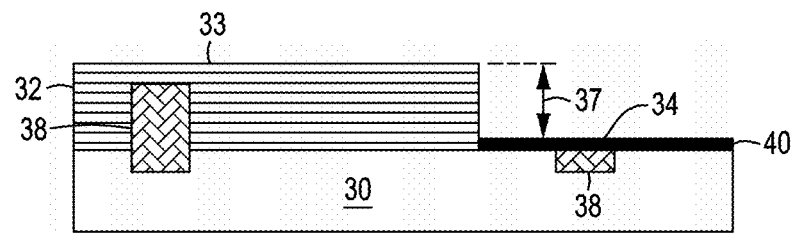
FIG. 3B depicts a die engaged with a substrate after dry etching in accordance with embodiments of the present disclosure.

FIG. 3A depicts a die 33 engaged with a substrate 30 prior to the dry etching process according to an embodiment and FIG. 3B depicts the same die 33 engaged with the same substrate 30 shown in FIG. 3A after the dry etching process. In embodiments, as depicted in FIG. 3A, the die 32 has an initial thickness 36 of greater than or equal to about 50 µm, or greater than or equal to about 70 µm, or greater than or equal to about 100 µm, or greater than or equal to about 200 µm prior to the dry etching of the top surface 33 of the die 32 with the plasma comprising fluorine radicals 54, and as depicted in FIG. 3B, the die 32 has a thickness of less than or equal to about 30 µm (also represented by distance 37 in FIG. 2) after the dry etching of the top surface 33 of the die 32.

Figure 3C:
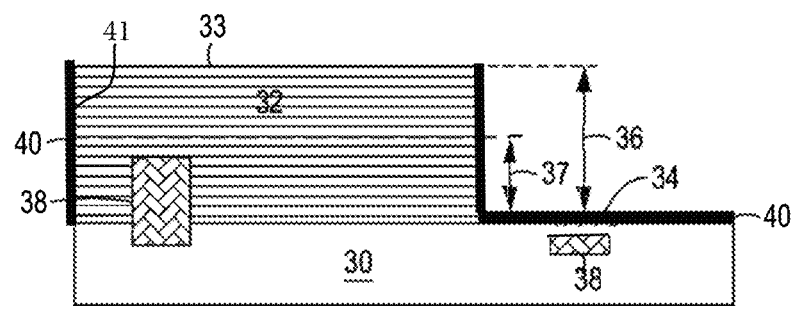
FIG. 3C depicts a die engaged with a substrate prior to dry etching in accordance with embodiments of the present disclosure.
Figure 3D:
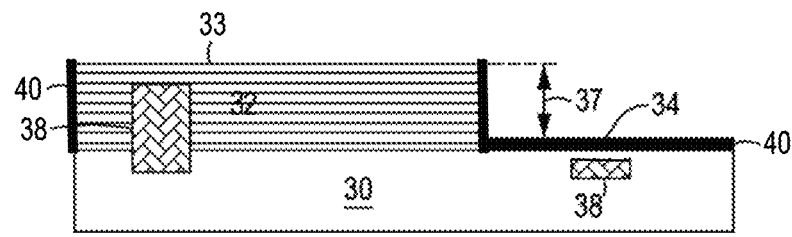
FIG. 3D depicts a die engaged with a substrate after dry etching in accordance with embodiments of the present disclosure.

FIG. 3C depicts an embodiment wherein the top surface of the substrate 34 and side wall of 32 comprises a protective layer 40 comprising SiN, SiCN, an oxygen-doped silicon nitride, a metal oxide other than silicon dioxide, or a combination thereof, to prevent lateral Si removal in isotropic Si etching. In other embodiments, the top surface of the substrate 34 has a protective layer comprising an organic material, such as a photo resist to prevent it from being removed during directional protective layer etching. As depicted in FIG. 3D, the die 32 has a thickness of less than or equal to about 30 µm after the dry etching of the top surface 33 of the die 32.

The methods described herein may be performed in individual etching chambers, that may be provided in a standalone configuration or as part of a cluster tool, for example, an ICP plasma etch chamber. Examples of processing chambers that may be adapted to benefit from the embodiments of the disclosure include Sym3® Processing Chamber, commercially available from Applied Materials, Inc., located in Santa Clara, Calif.

EMBODIMENTS

In accordance with embodiments of the disclosure, at least the following embodiments are contemplated.

E1. A method of thinning a die engaged with a substrate, comprising:
dry etching a top surface of the die with a plasma comprising fluorine to selectively remove the top surface of the die relative to a top surface of the substrate.

E2. The method according to embodiment E1, wherein the plasma comprising fluorine is formed from $SF_6$, $CF_4$, $C_4F_8$ or a combination thereof, and wherein the top surface of the die is removed at a rate of greater than or equal to about 1 µm/min.

E3. The method according to embodiment E1 or E2, wherein the die engaged with the substrate is a chip bonded to a wafer, the chip having a thickness of greater than or equal to about 50 µm prior to the dry etching of the top surface of the die, and the die having a thickness of less than or equal to about 30 µm after the dry etching of the top surface of the die.

E4. The method according to embodiments E1 through E3, wherein over 50 µm of a thickness of the die is removed.

E5. The method according to embodiments E1 through E4, wherein the substrate is maintained at a temperature of less than or equal to about 80° C. during the dry etching of the top surface.

E6. The method according to embodiments E1 through E5, wherein the substrate further comprises a protective layer disposed over at least a portion of the substrate.

E7. The method according to embodiment E6, wherein the protective layer comprises SiN, SiCN, oxygen-doped silicon nitride, a metal oxide layer, or a combination thereof.

E8. The method according to embodiment E6 or E7, wherein the protective layer comprises an organic photo resist.

E9. The method according to embodiments E1 through E8, wherein the die is bonded to a dielectric layer disposed on top of the substrate, comprising a metal oxide, SiCN, SiN, or a combination thereof, and wherein the dielectric layer is a protective layer which prevents the plasma comprising fluorine from dry etching a portion of the substrate located below the dielectric layer.

E10. The method according to embodiments E1 through E9, wherein a ratio of a rate at which the top surface of the die is removed relative to a rate at which the top surface of the substrate is removed is greater than or equal to about 100:1.

E11. The method according to embodiments E1 through E10, wherein the die, the substrate, or both comprise a metal pad, and wherein no portion of the metal pad is contacted by the plasma comprising fluorine.

E12. A method of thinning a chip bonded to a wafer substrate, comprising:
dry etching, in a processing chamber, a top surface of the chip with a plasma comprising fluorine formed from $SF_6$, $CF_4$, $C_4F_8$ or a combination thereof to selectively remove the top surface of the chip relative to a top surface of the wafer substrate;
wherein the chip comprises silicon;
wherein at least a portion of a top surface of the wafer substrate comprises a protective layer;
wherein at least one metal pad is embedded completely within the chip bonded to the wafer substrate, at least one metal pad is disposed beneath the protective layer, or both;

and
wherein no metal pad is contacted by the plasma comprising fluorine.

E13. The method according to embodiment E12, wherein the protective layer comprises SiN, SiCN, oxygen-doped silicon nitride, a metal oxide, or a combination thereof.

E14. The method according to embodiments E12 or E13, wherein the protective layer comprises a photo resist.

E15. The method according to embodiments E12 through E14, wherein the top surface of the chip is removed at a rate of greater than or equal to about 1 μm/min.

E16. The method according to embodiments E12 through E15 wherein the chip has a thickness of greater than or equal to about 50 μm prior to the dry etching of the top surface of the chip with the plasma comprising fluorine, and the chip has a thickness of less than or equal to about 30 μm after the dry etching of the top surface of the chip.

E17. The method according to embodiments E12 through E16, wherein over 50 μm of a thickness of the chip is removed.

E18. The method according to embodiments E12 through E17, wherein the wafer substrate is maintained at a temperature of less than or equal to about 80° C.

E19. A non-transitory computer readable medium, having instructions stored thereupon which, when executed, cause a processing chamber to perform a method for thinning of a die engaged with a substrate according to Embodiments E1 through E18.

E20. The non-transitory computer readable medium according to Embodiment E19,
wherein the die engaged with the substrate is a chip bonded to a wafer substrate;
wherein the plasma comprising fluorine formed from $SF_6$, $CF_4$, $C_4F_8$ or a combination thereof;
wherein the chip comprises silicon;
wherein at least a portion of a top surface of the wafer substrate comprises a protective layer;
wherein at least one metal pad is embedded completely within the chip bonded to the wafer substrate, at least one metal pad is disposed beneath the protective layer, or both; and
wherein no metal pad is contacted by the plasma comprising fluorine.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure. While the foregoing is directed to embodiments of the present disclosure, other and further embodiments of the disclosure may be devised without departing from the basic scope thereof.

The invention claimed is:

1. A method of thinning a die engaged with a substrate, comprising:
dry etching a top surface of the die with a plasma comprising fluorine to selectively remove the top surface of the die relative to a top surface of the substrate, wherein the top surface of the die is removed at a rate of greater than or equal to about 1.5 μm/min.

2. The method of claim 1, wherein the plasma comprising fluorine is formed from $SF_6$, $CF_4$, $C_4F_8$ or a combination thereof, and wherein the top surface of the die is removed at a rate of greater than or equal to about 3 μm/min.

3. The method of claim 1, wherein the die engaged with the substrate is a chip bonded to a wafer, the chip having a thickness of greater than or equal to about 50 μm prior to the dry etching of the top surface of the die, and the die having a thickness of less than or equal to about 30 μm after the dry etching of the top surface of the die.

4. The method of claim 1, wherein over 50 μm of a thickness of the die is removed.

5. The method of claim 1, wherein the substrate is maintained at a temperature of less than or equal to about 80° C. during the dry etching of the top surface.

6. The method of claim 1, wherein the substrate further comprises a protective layer disposed over at least a portion of the substrate.

7. The method of claim 6, wherein the protective layer comprises SiN, SiCN, oxygen-doped silicon nitride, a metal oxide layer, or a combination thereof.

8. The method of claim 6, wherein the protective layer comprises an organic photo resist.

9. The method of claim 1, wherein the die is bonded to a dielectric layer disposed on top of the substrate, comprising a metal oxide, SiCN, SiN, or a combination thereof, and wherein the dielectric layer is a protective layer which prevents the plasma comprising fluorine from dry etching a portion of the substrate located below the dielectric layer.

10. The method of claim 1, wherein a ratio of a rate at which the top surface of the die is removed relative to a rate at which the top surface of the substrate is removed is greater than or equal to about 100:1.

11. The method of claim 1, wherein the die, the substrate, or both comprise a metal pad, and wherein no portion of the metal pad is contacted by the plasma comprising fluorine.

12. A method of thinning a chip bonded to a wafer substrate, comprising:
dry etching, in a processing chamber, a top surface of the chip with a plasma comprising fluorine formed from $SF_6$, $CF_4$, $C_4F_8$ or a combination thereof to selectively remove the top surface of the chip relative to a top surface of the wafer substrate;
wherein the top surface of the chip is removed at a rate of greater than or equal to about 1.5 μm/min;
wherein the chip comprises silicon;
wherein at least a portion of a top surface of the wafer substrate and/or a die side wall comprises a protective layer;
wherein at least one metal pad is embedded completely within the chip bonded to the wafer substrate, at least one metal pad is disposed beneath the protective layer, or both; and
wherein no metal pad is contacted by the plasma comprising fluorine.

13. The method of claim 12, wherein the protective layer comprises SiN, SiCN, oxygen-doped silicon nitride, a metal oxide, or a combination thereof.

14. The method of claim 12, wherein the protective layer comprises a photo resist.

15. The method of claim 12, wherein the top surface of the chip is removed at a rate of greater than or equal to about 3 μm/min.

16. The method of claim 12, wherein the chip has a thickness of greater than or equal to about 50 μm prior to the dry etching of the top surface of the chip with the plasma comprising fluorine, and the chip has a thickness of less than or equal to about 30 μm after the dry etching of the top surface of the chip.

17. The method of claim 12, wherein over 50 μm of a thickness of the chip is removed.

18. The method of claim 12, wherein the wafer substrate is maintained at a temperature of less than or equal to about 80° C.

\* \* \* \* \*